United States Patent [19]

Uchiyama et al.

[11] Patent Number: 5,222,074
[45] Date of Patent: Jun. 22, 1993

[54] THERMAL DECOMPOSITION CELL

[75] Inventors: Kiyoshi Uchiyama; Tomoko Suzuki, both of Kawasaki, Japan; Tatsuo Yokotsuka, London, United Kingdom; Akira Takamori, Atsugi; Masato Nakajima, Kawasaki, both of Japan

[73] Assignee: Matsushita Electric Industrial Co., Ltd., Osaka, Japan

[21] Appl. No.: 709,280

[22] Filed: Jun. 3, 1991

[30] Foreign Application Priority Data

Jun. 5, 1990 [JP] Japan .................. 2-148296

[51] Int. Cl.$^5$ ............................ H01J 37/305
[52] U.S. Cl. .......................... 373/10; 373/11; 373/109; 373/111; 118/719; 118/730; 156/612; 427/252; 427/255.1
[58] Field of Search ........... 219/121.19, 121.2, 121.33; 118/719-730; 156/DIG. 103, 612, 662; 373/10, 11, 109, 111; 427/252, 255.1, 255.3

[56] References Cited

U.S. PATENT DOCUMENTS

| | | | |
|---|---|---|---|
| 4,674,442 | 6/1987 | Blum | 118/719 |
| 4,699,083 | 10/1987 | Huet et al. | 118/719 |
| 4,792,378 | 12/1988 | Rose et al. | 118/728 |
| 4,986,216 | 1/1991 | Ohmori et al. | 118/730 |
| 4,990,374 | 2/1991 | Keeley et al. | 427/255.1 |

FOREIGN PATENT DOCUMENTS

| | | |
|---|---|---|
| 62-143894 | 6/1987 | Japan . |
| 62-143895 | 6/1987 | Japan . |
| 190032 | 4/1989 | Japan . |
| 1224295 | 9/1989 | Japan . |

Primary Examiner—Bruce A. Reynolds
Assistant Examiner—Tu Hoang
Attorney, Agent, or Firm—Pollock, VandeSande & Priddy

[57] ABSTRACT

A thermal decomposition cell for producing a molecular beam from a material gas, includes: a crucible maintained at a given temperature necessary for thermal decomposition of the material gas which is effused in the crucible in a given direction; and a thermal decomposition baffle provided in the crucible and heated to a given temperature necessary for thermal decomposition of the material gas for producing the molecular beam by thermal-decomposing of the material gas such that the material gas is baffled in substantially all directions, the thermal decomposition baffle being made of a given metal to cause the thermal decomposition of the material gas. The thermal decomposition baffle may comprise a fiber or a cloth made of the metal loaded in the crucible. The thermal decomposition baffle may comprise a plurality of different sized rooms made of the given metal, each of said rooms having fine holes to allow the material gas to pass therethrough, and successively arranged in such a manner that said material gas moves from one room toward the other adjacent thereto.

26 Claims, 2 Drawing Sheets

THERMAL DECOMPOSITION CELL

BACKGROUND OF THE INVENTION

1. Field of the Invention

This invention relates to a thermal decomposition cell for producing molecular beams of an element from material gas.

2. Description of the Prior Art

A thermal decomposition cell is known. Such cell comprises a cell body, a crucible contained in the cell body, a heater for heating the crucible, a thermal decomposition baffle for producing a molecular beam from a material gas using heat from the crucible, and a gas supply tube for supplying a material gas of an element into the crucible through the bottom of the crucible. The material gas supplied to the crucible is subject to heat decomposition to produce a molecular beam used for epitaxial growth on a substrate placed on the top opening of the crucible. Generally, an epitaxial method using the molecular beam from a gas source is known as a thin-film-forming technique of the semiconductor materials. In this method, a material gas (for example, Arsine, Phosphine, etc.), which contributes crystal growth on the substrate is used. Generally, a thermal decomposition temperature of the material gas may be higher than the substrate growth temperature. In this case, the molecular beam is produced as follows:

The crucible and the thermal decomposition baffle of the thermal decomposition cell is heated to a temperature such that the material gas is subject to thermal decomposition. Then, the material gas is supplied into the crucible from the bottom of the crucible. The material gas is subject to thermal decomposition by contacting the thermal decomposition baffle, so that the molecular beam is produced. The molecular beam is supplied to a substrate on which crystal growth of the epitaxial layer is to be carried out.

In the conventional thermal decomposition cell, a thermal decomposition baffle made of pyrotitic Boron Nitride (PBN), metal tantalum, or the like is formed in a board. One or more boards of the thermal decomposition baffle are used in the crucible to heat the material gas. In such board type thermal decomposition baffle, the thermal decomposition baffle is formed to have a honeycomb structure to increase a contacting area of the material gas with the decomposition baffle to improve thermal decomposition efficiency of the material gas.

However, in the conventional thermal decomposition cell mentioned above, there is a limit on increasing its surface area because the thermal decomposition baffle is formed in a board. Therefore, it is difficult to increase the thermal decomposition efficiency of the material gas to a considerable extent. Accordingly, in the conventional thermal decomposition cell, in order to supply the molecular beam from a gas source to carry out epitaxial growth, it is necessary to introduce a large amount of material gas into the thermal decomposition cell. Therefore, there is a problem that an exhaust pump having a large capacity is required to introduce such a large amount of material gas.

SUMMARY OF THE INVENTION

The present invention has been developed in order to remove the above-described drawbacks inherent to the conventional thermal decomposition cell.

According to the present invention there is provided a first thermal decomposition cell for producing a molecular beam from a material gas by thermal decomposition, comprising: a crucible maintained at a given temperature necessary for thermal decomposition of the material gas which is effused in the crucible in a given direction; and a thermal decomposition baffle provided in the crucible and heated to the given temperature for producing the molecular beam by thermal-decomposing of the material gas such that the material gas is baffled in substantially all directions, the thermal decomposition baffle being made of a given metal to cause the thermal decomposition of the material gas. The thermal decomposition baffle may comprise at least one fiber or cloth loaded in the crucible.

According to the present invention there is also provided a second thermal decomposition cell as mentioned in the first thermal decomposition cell, wherein the thermal decomposition baffle comprises a room made of the given metal in which the material gas is effused, the room having fine holes to allow the material gas to pass therethrough.

According to the present invention there is further provided a third thermal decomposition cell for producing a molecular beam from a material gas as mentioned in the first thermal decomposition cell, wherein the thermal decomposition baffle comprises a plurality of differently sized chambers made of the given metal, each of the rooms having fine holes to allow the material gas to pass therethrough, and successively arranged in such a manner that the material gas moves from one room toward the other adjacent thereto.

BRIEF DESCRIPTION OF THE DRAWINGS

The object and features of the present invention will become more readily apparent from the following detailed description taken in conjunction with the accompanying drawings in which.

DETAILED DESCRIPTION OF THE INVENTION

Hereinbelow will be described a first embodiment of this invention.

Figure 1:
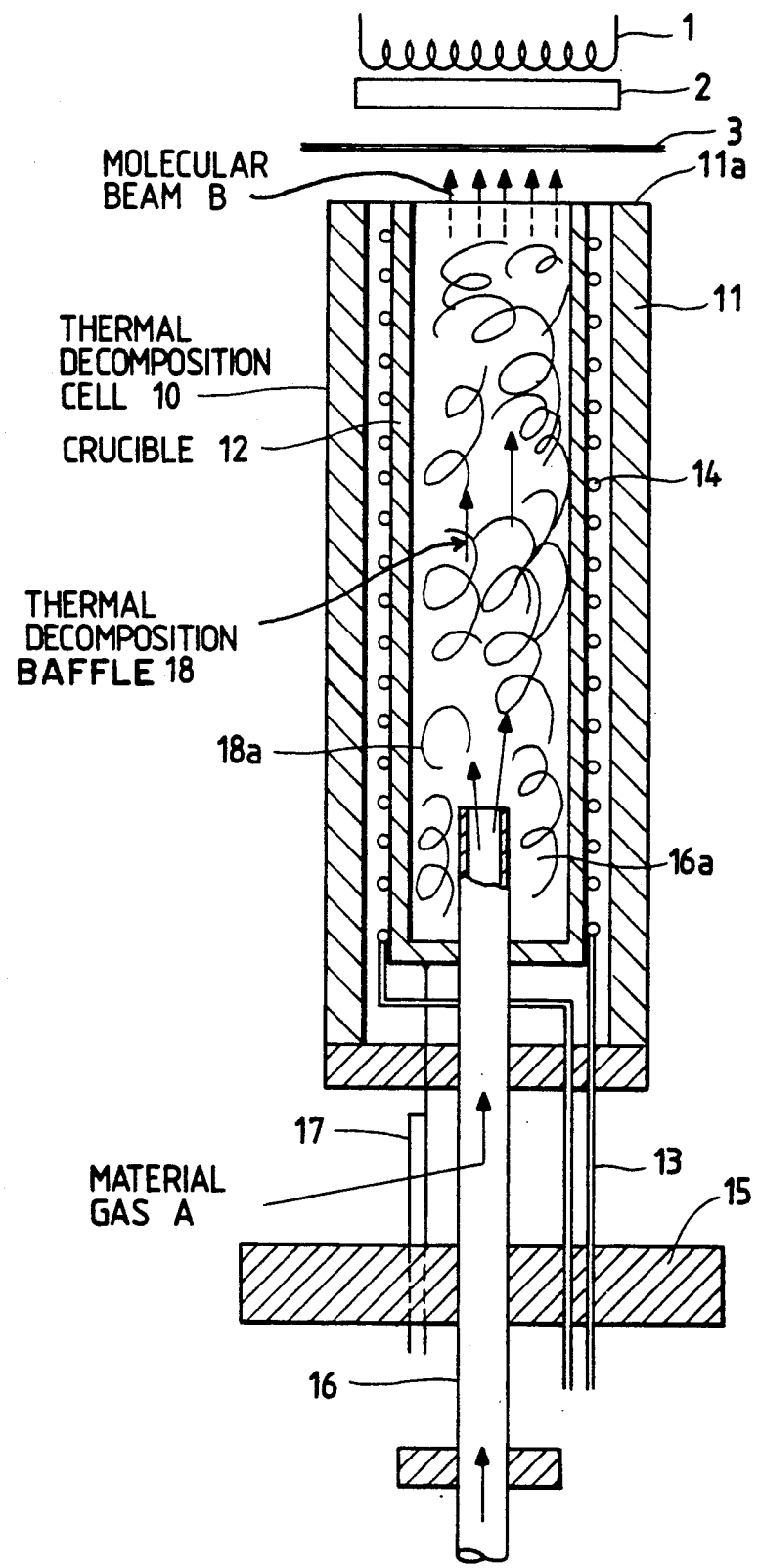
FIG. 1 is a cross-sectional view of a first embodiment of the invention of the thermal decomposition cell.

FIG. 1 is a cross-sectional view of a thermal decomposition cell of a first embodiment of the invention. An opening of the thermal decomposition cell 10 confronts a substrate 2 through a shutter 3. A heater 1 heats the substrate 2 to a temperature necessary for carrying out epitaxial growth. The thermal decomposition cell 10 comprises a cell body 11 having a rectangular shaped bottom, an opening 11a provided on the top thereof, a heat-resisting and anticorrosion cylindrical crucible 12 contained in the cell body 11, a heater 14 which is connected through a feedthrough 13 to a not shown external circuit and is provided around the crucible 12, and a thermal decomposition baffle 18 packed in the crucible 12. The heater 14 heats the crucible 12 to a high temperature sufficient for thermal decomposition.

A gas outflow port 16a of a gas introducing pipe 16 fixed by a flange 15 is inserted into the bottom of the crucible 12 and exposed in the chamber of the crucible 12 as shown. A material gas A of a given element can be introduced through the gas introducing pipe 16. A thermocouple 17 is provided on the crucible 12 to measure and control a temperature of the crucible 12.

As the thermal decomposition baffle 18, a material which can be subjected to thermal decomposition, for example, metal tantalum, is formed into a fiber or a wire(s) 18a whose diameter is less than 1 mm. The wire 18a can be wadded to form wire wool as the thermal decomposition baffle 18. Then, the crucible 12 is filled with the wires 18a as the thermal decomposition baffle 18, so that the area of the thermal decomposition baffle 18 which comes into contact with the material gas A when the material gas A is passed through the crucible 12 becomes extremely large.

Hereinbelow will be described operation of thin-film formation by the thermal decomposition cell 10 described in the above-mentioned embodiment.

The crucible 12 in the thermal decomposition cell 10 is heated to a high temperature necessary for carrying out thermal decomposition under current control of the heater 14 by the thermocouple 17. Therefore, the fibered thermal decomposition baffle 18 in the crucible 12 is also at a high temperature which is essentially the same as that of the crucible 12. Therefore, when the material gas A of the given element is supplied into the crucible 12 from the gas outflow port 16a of the gas introducing pipe 16, the material gas A advances to the exit of the crucible 12 smoothly through the fibered wires 18a of the thermal decomposition baffle 18. Therefore, the material gas A contacts an infinite numbers of wadded wires 18a, so that the material gas A is heated at a high efficiency. In other words, the material gas A is baffled in substantially all directions. Heat thus produced promotes decomposition to produce the molecular beam B. The thermal decomposition of the material gas A in this condition produces a large amount of the molecular beam B from the opening 11a of the crucible 12 because the thermal decomposition is developed uniformly over a cross-sectional area of the opening of the crucible 12 at a high efficiency.

When the shutter 3 is opened, a large amount of the molecular beam B is supplied to the substrate 2 heated to a given substrate growth temperature by the heater 1. Thus, crystal growth of an epitaxial thin film layer is formed on the surface of the substrate 2 by this molecular beam B.

The thickness of the wires 18a of the thermal decomposition baffle 18 mentioned above can be varied with the position of the wires 18a in the axial direction or radial direction of the crucible 12. Moreover, a wire cloth made from the wires 18a can be used as the thermal decomposition baffle 18.

As mentioned above, the efficiency of thermal decomposition of the thermal decomposition cell 10 of the invention can be improved by forming the thermal decomposition baffle 18 into a fiber shape, so that the size of the exhaust pump used for supplying the material gas A can be reduced.

Figure 2:
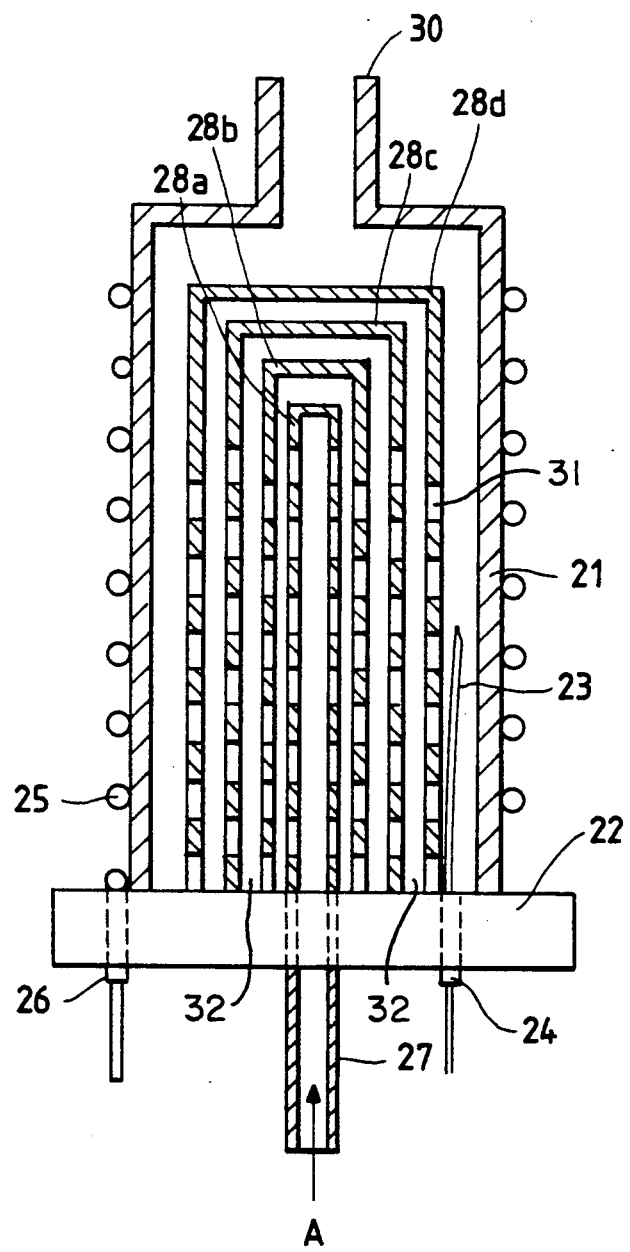
FIG. 2 is a cross-sectional view of a second embodiment of the invention of the thermal decomposition cell.

FIG. 2 is a cross-sectional view of a second embodiment of a thermal decomposition cell. In FIG. 2, the thermal decomposition cell comprises a thermal decomposition cell outer tube 21 for forming a chamber therewithin an exhaust port 30 at one end of the outer tube 21, a flange 22 closing another end of the outer tube 21, and first to fourth baffles 28a-28d, having cylindrical cup shapes, arranged coaxially within the outer tube 21 in the order of first to fourth baffles 28a-28d, i.e., the diameters of the first to fourth baffle increase in the order from first to fourth baffles 28a-28d so that the baffle 28a has a chamber therein and each of the baffles 28b-28d is spatially separated by adjacent surface walls to form, for example respective spaces 32. A tube 27 for introducing gas is integrated through flange 22 to feed material gas A to chamber 33. Openings of first to fourth baffles 28a-28d are closed by the flange 22. A heater 25 heats the outer tube 21. Leads are provided to heater 25 via a feedthrough 26. Then, the first to fourth baffles 28a-28d are heated by the outer tube 21. A thermocouple 23 is provided in the space 32 of the outer tube 21 to control the temperature of the baffles 28a-28d. The leads of the thermocouple 23 are drawn out to the exterior of the crucible 12 via a feedthrough 24. Each of baffles 28a-28d has many small holes 31 in its vertical walls for transferring the material gas A in the radial direction therethrough, i.e., the small holes 31 are formed the walls of baffles 28a-28d, parallel to the direction of flow of the material gas A. The number of the baffles 28a-28d can be varied. The baffles 28a to 28d are thin plates made of tantalum. In the second embodiment, the material gas A flows into the spaces 32 of the baffles 28a-28d and through the small holes 31 to contact the tantalum surfaces and the chamber of the outer tube 21, so that the contact area of the material gas A with the baffles 28a-28d is increased.

Hereinbelow will be described the operation of the second embodiment.

Baffles 28a-28d are heated to a given temperature. The thermocouple 23 measures the temperature of the space 32 of the outer tube 21. The material gas A introduced to the thermal decomposition cell through the gas introduce tube 27 is supplied to the space 32 of the outer tube 21 through the small holes 31 of baffles 28a-28d. More specifically, at first, the material gas A moves longitudinally along the axis of tube 27 to contact the wall surfaces of the baffle 28a, and then it moves in the lateral direction, perpendicularly through the small holes 31 to contact the small holes 31 of the other walls. In other words, the material gas A is baffled in substantially all directions.

The position of a small hole of each of baffles 28a-28d is shifted with respect to that of the neighbor baffle to prevent the material gas from passing through the holes 31 of the different wall layers of the baffles directly.

As mentioned above, in the second embodiment, the contact area of the material gas with baffles 28a-28d is increased, so that the material gas is subject to thermal decomposition at a high efficiency.

What is claimed is:

1. A thermal decomposition cell for producing a molecular beam from a material gas by thermal decomposition, comprising:
   (a) a crucible heated to and maintained at a temperature sufficient to thermally decompose said material gas effused into said crucible along a first direction; and
   (b) a thermal decomposition baffle provided in said crucible and heated to said temperature for producing said molecular beam by thermal-decomposing said material gas such that said material gas is baffled in substantially all directions, said thermal decomposition baffle being made of a metal.

2. A thermal decomposition cell as claimed in claim 1, wherein said thermal decomposition baffle comprises at least one fiber.

3. A thermal decomposition cell as claimed in claim 2, wherein said fiber is wadded.

4. A thermal decomposition cell as claimed in claim 2, wherein said fiber is formed into a cloth.

5. A thermal decomposition cell as claimed in claim 1, wherein said thermal decomposition baffle comprises a plurality of fibers having different thicknesses, said plurality of fibers being arranged axially within said crucible.

6. A thermal decomposition cell as claimed in claim 1, wherein said thermal decomposition baffle comprises at least one chamber having walls made of said metal and into which said material gas is effused, the walls of said chamber having small holes to allow said material gas to pass therethrough.

7. A thermal decomposition cell for producing a molecular beam from a material gas as claimed in claim 1, wherein said thermal decomposition baffle comprises a plurality of different sized chambers each made of said metal, each chamber being enclosed by an incrementally larger chamber, each of said chambers having small holes formed at its walls to allow said material gas to pass therethrough, said material gas moving from one chamber to an adjacent chamber.

8. A thermal decomposition cell for producing a molecular beam from a material gas, comprising:
 (a) a crucible heated to and maintained at a temperature sufficient to thermally decompose said material gas;
 (b) a tube for providing said material gas into said crucible; and
 (c) a thermal decomposition baffle comprising at least one fiber provided in said crucible for producing said molecular beam by thermal-decomposing said material gas using heat from said crucible, said fiber being made of a metal.

9. A thermal decomposition cell as claimed in claim 8, wherein said fiber is wadded.

10. A thermal decomposition cell as claimed in claim 8, wherein said fiber is woven.

11. A thermal decomposition cell for producing a molecular beam from a material gas, comprising:
 (a) a crucible heated to and maintained at a temperature sufficient to thermally decompose said material gas;
 (b) a tube for providing said material gas into said crucible in a first direction; and
 (c) a thermal decomposition baffle comprising a plurality of fibers having different thicknesses provided in said crucible for producing said molecular beam by thermal-decomposing said material gas using heat from said crucible, said fibers being made of a metal, said plurality of fibers being arranged axially within said crucible.

12. A thermal decomposition cell as claimed in claim 11, wherein said plurality of fibers are arranged along said first direction in said crucible, said plurality of fibers having fibers ranging from thickest fibers to thinnest fibers, the thickest fibers being arranged at one axial end while the thinnest fibers being arranged at an opposed axial end of said crucible, the thicknesses of said plurality of fibers within said crucible incrementally decrease from said one axial end to said opposed axial end.

13. A thermal decomposition cell as claimed in claim 11, wherein said plurality of fibers are arranged along an axis in a direction perpendicular to an axis extending in said first direction in said crucible, wherein the thicknesses of the fibers arranged along said perpendicular axis changes incrementally.

14. A thermal decomposition cell for producing a molecular beam from a material gas by thermal decomposition, comprising:
 (a) a heating means;
 (b) a crucible heated to and maintained at a predetermined temperature sufficient for thermal decomposition of said material gas by said heating means, said material gas being effused into said crucible along an effusing direction; and
 (c) a thermal decomposition baffle for thermal-decomposing said material gas effused into said crucible to generate said molecular beam, said thermal decomposition baffle being provided in said crucible and heated to a temperature substantially equal to said predetermined temperature, wherein said material gas is baffled substantially in all directions in said crucible by said thermal decomposition baffle.

15. A thermal decomposition cell as claimed in claim 14, wherein said thermal decomposition baffle comprises at least one fiber-like member wadded to form a cotton-like configuration in said crucible.

16. A thermal decomposition cell as claimed in claim 15, wherein said fiber-like member is formed into a cloth.

17. A thermal decomposition cell as claimed in claim 14, wherein said thermal decomposition baffle comprises a plurality of fiber-like members.

18. A thermal decomposition cell as claimed in claim 17, wherein said plurality of fiber-like members have different thicknesses.

19. A thermal decomposition cell as claimed in claim 14, wherein said thermal decomposition baffle comprises at least one chamber having walls into which said material gas is effused, the walls of said chamber having small holes through which said material gas passes.

20. A thermal decomposition cell as claimed in claim 19, wherein said thermal decomposition baffle comprises a plurality of different sized chambers each having corresponding walls, the walls of each of said chambers having small holes through which said material gas passes, said chambers ranging in size from a largest chamber to a smallest chamber, and each but the largest chamber being enclosed by an incrementally larger chamber to allow said material gas to move from one chamber to an adjacent chamber.

21. A thermal decomposition cell for producing a molecular beam from a material gas comprising:
 (a) a crucible heated to and maintained at a predetermined temperature sufficient to thermally decompose said material gas by heating means;
 (b) a tube for effusing said material gas into said crucible; and
 (c) a thermal decomposition baffle for thermal-decomposing said material gas effused into said crucible to generate said molecular beam, said thermal decomposition baffle being provided in said crucible and heated to a temperature substantially equal to said predetermined temperature, wherein said material gas is baffled substantially in all directions in said crucible by said thermal decomposition baffle.

22. A thermal decomposition cell as claimed in claim 21, wherein said thermal decomposition baffle comprises at least one fiber-like member wadded to form a cotton-like configuration in said crucible.

23. A thermal decomposition cell as claimed in claim 22, wherein said fiber-like member is formed into a cloth.

24. A thermal decomposition cell as claimed in claim 14, wherein said thermal decomposition baffle comprises at least one room in which said material gas is effused, said room having fine holes to allow said material gas to pass therethrough.

25. A thermal decomposition cell for producing a molecular beam from a material gas by thermal decomposition, comprising:
a crucible heated to and maintained at a temperature sufficient to thermally decompose said material gas effused into said crucible along a first direction; and
a thermal decomposition baffle having a plurality of concentric chambers incrementally sized from a smallest chamber to a largest chamber each having walls made of a metal provided in said crucible, the walls of each of said chambers having fine holes to enable said material gas to diffuse through said chambers in a direction perpendicular to said first direction such that said material gas is baffled in substantially all directions, said baffle being heated to said temperature for producing said molecular beam by thermal-decomposing said material gas.

26. A thermal decomposition cell for producing a molecular beam from a material gas by thermal decomposition, comprising:
a crucible heated to and maintained at a temperature sufficient to thermally decompose said material gas effused into said crucible along a first direction; and
a thermal decomposition baffle having a plurality of concentric chambers incrementally sized from a smallest chamber to a largest chamber each having walls made of a metal provided in said crucible, the walls of each of said chambers having fine holes to enable said material gas to diffuse radially through said chambers with respect to said first direction such that said material gas is baffled in substantially all directions, said baffle being heated to said temperature for producing said molecular beam by thermal-decomposing said material gas.

* * * * *